United States Patent
Hou et al.

(10) Patent No.: US 9,929,115 B2
(45) Date of Patent: Mar. 27, 2018

(54) DEVICE WITH OPTIMIZED THERMAL CHARACTERISTICS

(71) Applicant: TAIWAN SEMICONDUCTOR MANUFACTURING COMPANY LTD., Hsinchu (TW)

(72) Inventors: Hao-Cheng Hou, Hsinchu (TW); Jung Wei Cheng, Hsinchu (TW); Tsung-Ding Wang, Kaohsiung (TW); Ming-Che Liu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/017,160

(22) Filed: Feb. 5, 2016

(65) Prior Publication Data
US 2017/0229410 A1    Aug. 10, 2017

(51) Int. Cl.
*H01L 23/00* (2006.01)
*H01L 23/31* (2006.01)
*H01L 21/56* (2006.01)

(52) U.S. Cl.
CPC ............ *H01L 24/13* (2013.01); *H01L 21/565* (2013.01); *H01L 23/3107* (2013.01); *H01L 24/03* (2013.01); *H01L 24/05* (2013.01); *H01L 24/11* (2013.01); *H01L 2224/0401* (2013.01); *H01L 2224/1134* (2013.01); *H01L 2224/13017* (2013.01); *H01L 2224/13018* (2013.01); *H01L 2224/13022* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2924/20646* (2013.01); *H01L 2924/20647* (2013.01); *H01L 2924/20648* (2013.01); *H01L 2924/20649* (2013.01)

(58) Field of Classification Search
CPC ......... H01L 24/13; H01L 24/03; H01L 24/05; H01L 24/11; H01L 21/565; H01L 23/3107
See application file for complete search history.

(56) References Cited

U.S. PATENT DOCUMENTS

| | | | | |
|---|---|---|---|---|
| 5,003,374 A | * | 3/1991 | Vokoun, III | H01L 21/78 174/255 |
| 6,198,170 B1 | * | 3/2001 | Zhao | H01L 24/03 257/781 |
| 6,245,595 B1 | * | 6/2001 | Nguyen | H01L 21/563 228/180.22 |
| 6,255,586 B1 | * | 7/2001 | Kim | H01L 24/03 174/538 |
| 7,847,198 B2 | * | 12/2010 | Shimoishizaka | H01L 21/4853 174/260 |
| 2005/0231065 A1 | * | 10/2005 | Fu | G02B 26/0841 310/309 |
| 2009/0181223 A1 | * | 7/2009 | Buchwalter | B23K 1/0016 428/198 |

* cited by examiner

*Primary Examiner* — Benjamin Sandvik
*Assistant Examiner* — Gustavo Ramallo
(74) *Attorney, Agent, or Firm* — WPAT, P.C., Intellectual Property Attorneys; Anthony King

(57) ABSTRACT

A semiconductor device includes a semiconductor substrate, a conductive pad on the semiconductor substrate, and a conductor over the conductive pad. The semiconductor device further has a molding compound surrounding the semiconductor substrate, the conductive pad and the conductor. In the semiconductor device, the conductor has a stud shape.

20 Claims, 23 Drawing Sheets

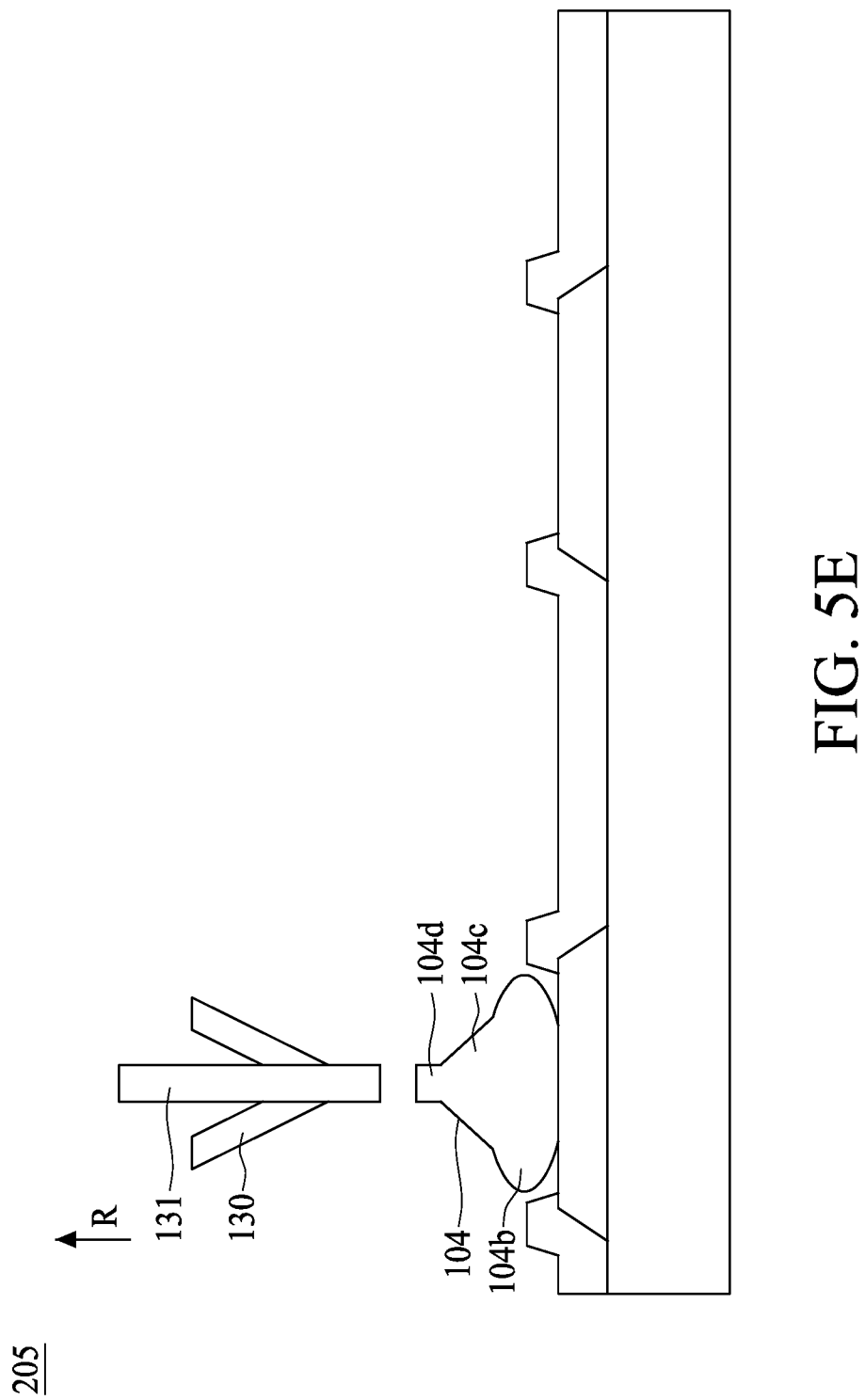

DEVICE WITH OPTIMIZED THERMAL CHARACTERISTICS

FIELD

The disclosure relates to a semiconductor device and a method of manufacturing a semiconductor device.

BACKGROUND

Electronic equipment involving semiconductor devices are indispensable from our daily life. With the advancement of electronic technology, electronic equipment become more complicated and involve greater amount of integrated circuitry for executing the desired multi-functionality. Thus, manufacturing of the electronic equipment includes more and more steps of assembly and processing as well as materials for producing the semiconductor devices in the electronic equipment. Therefore, there is a continuous demand on simplifying the steps of production, increasing production efficiency and lowering associated manufacturing cost on each of the electronic equipment.

During the operations of manufacturing the semiconductor devices, the semiconductor devices are assembled with numbers of integrated components including various materials with difference in thermal properties. As such, the integrated components are in undesired configurations. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A-FIG. 5K are operations of a method of manufacturing a semiconductor devices in accordance with some embodiments.

DETAILED DESCRIPTION

Figure 1:
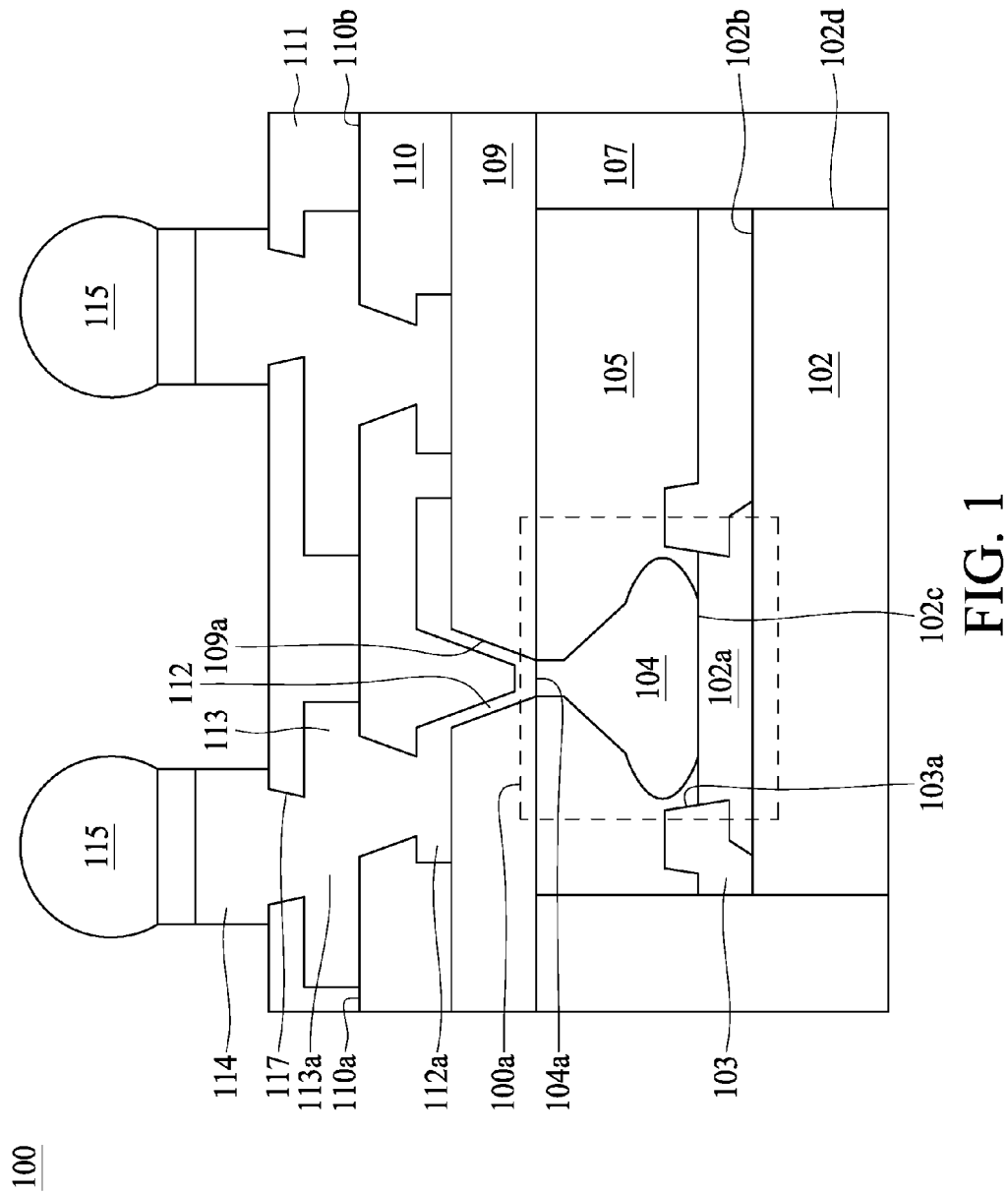
FIG. 1 is a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device is provided to electrically connect a component to a conductive trace in a cost-effective fashion. The semiconductor device includes a conductor electrically connecting a component to a conductive trace. In some embodiments, the conductor has an irregular and rounded cone shape and the conductor can be manufactured by wire bonding technology. Through the conductor, a more cost-effective approach is provided to manufacture a semiconductor device.

FIG. 1 is an embodiment of a semiconductor device 100. Semiconductor device 100 includes a semiconductor substrate 102. In some embodiments, the semiconductor substrate 102 includes semiconductor materials such as silicon, and is fabricated with a predetermined functional circuit within the semiconductor substrate 102 produced by various operations such as photolithography, etch, deposition, plating, etc. In some embodiments, the semiconductor substrate 102 is singulated from a silicon wafer by a mechanical or laser blade. In some embodiments, the semiconductor substrate 102 is in a quadrilateral, a rectangular or a square shape.

The semiconductor substrate 102 includes a surface 102b and a conductive pad 102a is disposed on the surface 102b. In some embodiments, the conductive pad 102a is electrically connected with a circuitry external to the semiconductor substrate 102, so that a circuitry internal to the semiconductor substrate 102 electrically connects with the circuitry external to the semiconductor substrate 102 through the conductive pad 102a. In some embodiments, the conductive pad 102a is configured for electrically coupling with a conductive bump through a conductive trace attached on the conductive pad 102a, so that the circuitry internal to the semiconductor substrate 102 connects with the circuitry external to the semiconductor substrate 102 from the conductive pad 102a to the conductive bump through the conductive trace. In some embodiments, the conductive pad 102a includes gold, silver, copper, nickel, tungsten, aluminum, palladium and/or alloys thereof.

In some embodiments, a passivation 103 is disposed on the surface 102b of the semiconductor substrate 102 and over the conductive pad 102a. In some embodiments, the passivation 103 surrounds the conductive pad 102a and a portion of the passivation 103 is adjacent to an opening 103a. In some embodiments, the passivation 103 partially covers a top surface 102c of the conductive pad 102a. The passivation 103 is configured for providing an electrical insulation and a moisture protection for the semiconductor substrate 102, so that the semiconductor substrate 102 is isolated from ambient environment. In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes an opening 103a above the conductive pad 102a for exposing a portion of the top surface 102c of the conductive pad 102a and thus for electrically connecting the conductive pad 102a with the circuitry external to the semiconductor substrate 102 through the conductive trace.

In some embodiments, a conductor 104 is disposed over the top surface 102c of the conductive pad 102a as in FIG. 1. In some embodiments, the conductor 104 is on an exposed portion of the top surface 102c. The conductor 104 is extended from the exposed portion of the top surface 102c to a top surface 104a of the conductor 104 as in FIG. 1. In some embodiments, the conductor 104 is extended along a normal direction of the surface 102b. In some embodiments, the conductor 104 is substantially upright and supported by the conductive pad 102a.

Figure 2:
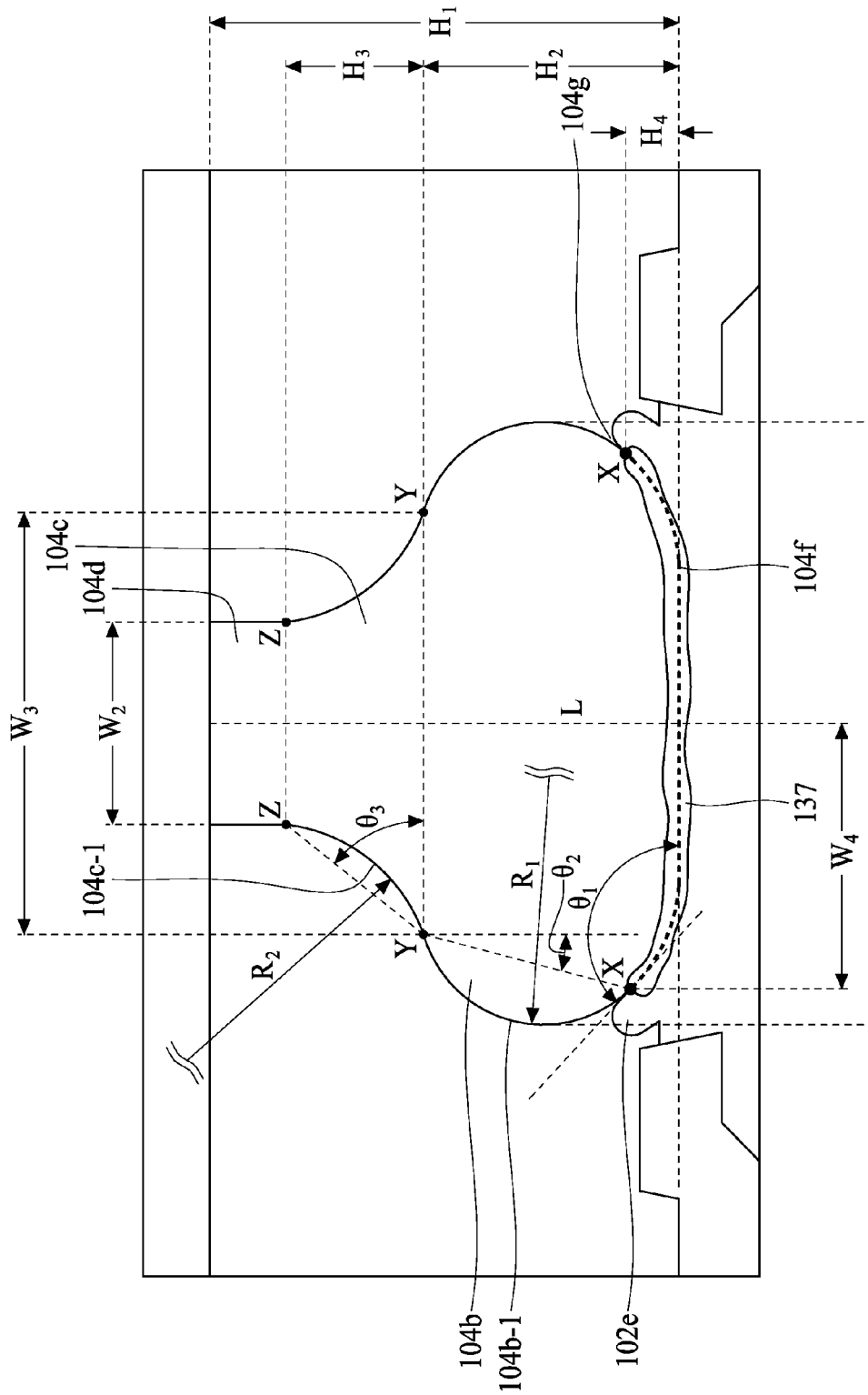
FIG. 2 is an enlarged view of a portion of a semiconductor device in FIG. 1 in accordance with some embodiments.

FIG. 2 is an enlarged view of the conductor 104. In some embodiments, the conductor 104 has an irregular, rounded cone shape. The conductor 104 may be formed by a wire bonding process. In some embodiments, the conductor 104 is a portion of a wire bond structure. In some embodiments, the conductor 104 further includes a body 104b, a neck 104c and a head 104d. In some embodiments, the conductor 104 has a stud shape. In some embodiments, the conductor 104 is a portion of a stud bump formed in a wire bonding process. To create the stud bump, a ball is formed by a standard ball bumping process. After the ball is bonded to a die pad, the wire clamps are closed and the bondhead moves to tear the wire.

In some embodiments, to dispose the conductor 104 to the conductive pad 102a, a controlled bonding process uses a specified combination of pressure, heat and ultrasonic energy is performed. In some embodiments, a eutectic layer 137 is formed at an interface between the conductor 104 and the conductive pad 102a. The eutectic layer 137 is in contact with the conductive pad 102a at surface 104f. The eutectic layer 137 may include a compound of the conductive pad 102a and the conductor 104. In some embodiments, the eutectic layer 137 has a melting point lower than the conductive pad 102a or the conductor 104.

In some embodiments, a protrusion 102e of the conductive pad 102a is adjacent the eutectic layer 137. In some embodiments, a crevice 104g is between the conductor 104 and the protrusion 102e. In some embodiments, a contact point X is defined as an initial point of the crevice 104g. In some embodiments, a width $W_4$ is defined as a horizontal distance between a center line L of the conductor 104 and the contact point X. In some embodiments, the width $W_4$ ranges from about 25 um to about 125 um. In some embodiments, a vertical height $H_4$ from the surface 104f to the contact point X ranges from about 0.1 um to about 4 um.

In some embodiments, the body 104b has a sidewall 104b-1, which is in a curved shape. In some embodiments, the radius of curvature of sidewall 104b-1 is $R_1$, and the radius $R_1$ ranges from about 20 um to about 250 um. In some embodiments, the neck 104c has a sidewall 104c-1. In some embodiments, the sidewall 104c-1 is in a curved shape. In some embodiments, the radius of curvature of sidewall 104c-1 is $R_2$, and the radius $R_2$ ranges from about 5 um to about 300 um.

In some embodiments, a point Y is defined as an external surface intersection of the body 104b and the neck 104c. In some embodiments, an angle $\theta_2$ is defined as an angle between the line XY and a vertical line as in FIG. 2. In some embodiments, the angle $\theta_2$ is about −30 degrees to about +30 degrees. In some embodiments, a point Z is defined as an external surface intersection of the neck 104c and the head 104d. In some embodiments, an angle $\theta_3$ is defined as an angle between the line YZ and a horizontal line YY as in FIG. 2. In some embodiments, the angle $\theta_3$ is about 0 degree to about +75 degrees.

In some embodiments, a contact angle $\theta_1$ is between a tangent line to the sidewall 104b-1 at the contact point X and a horizontal line as in FIG. 2. The contact angle $\theta_1$ may be about +100 degrees to about +180 degrees. Preferably, the contact angle $\theta_1$ may be about +120 degrees to about +150 degrees. In some embodiments, the conductor 104 has a height $H_1$. In some embodiments, the height $H_1$ ranges from about 20 um to about 900 um. Preferably, the height $H_1$ may range from about 25 um to about 100 um. In some embodiments, the body 104b has a width $W_1$ ranging from about 50 um to about 250 um. In some embodiments, the head 104d has a width $W_2$ ranging from about 25 um to about 75 um. In some embodiments, the neck 104c is in a trapezoid-like shape with a lower line YY and upper line ZZ. The upper portion has a width $W_2$ and the lower portion has a width $W_3$ as in FIG. 2. In some embodiments, $W_3$ ranges from about 50 um to about 250 um.

In some embodiments, the shape of the neck 104c is like a circular cone. The neck 104c has a height $H_3$. In some embodiments, the height $H_3$ ranges from about 5 um to about 50 um. In some embodiments, the head 104d has a shape of a portion of a wire. In some embodiments, a wide variety of materials is selected for the conductor 104 such as metal or metal alloy. In some embodiments, the conductor 104 includes copper (Cu), gold (Au), platinum (Pt), titanium (Ti), nickel (Ni), aluminum (Al) and/or alloys thereof.

In some embodiments, a polymeric material 105 is disposed over the passivation 103 and surrounding the conductor 104. The polymeric material 105 is a dielectric filling inserted around the conductor 104 in order to isolate adjacent conductors or avoid moisture attack. In some embodiments, the polymeric material 105 includes a material such as epoxy, polyimide, polybenzoxazole (PBO), solder resist (SR), ABF film, and the like. In some embodiments, the conductor 104 and polymeric material 105 are substantially coplanar.

In some embodiments, a molding 107 is disposed to surround the semiconductor substrate 102. In some embodiments, the molding 107 is disposed adjacent to a sidewall 102d of the semiconductor substrate 102. In some embodiments, top surfaces of the conductor 104, polymeric material 105 and the molding 107 are substantially coplanar.

In some embodiments, the semiconductor device 100 includes a polymer 109 disposed over the molding 107, the conductor 104 and the polymeric material 105. A recessed portion 109a of the polymer 109 is formed above the top surface 104a of the conductor 104 as in FIG. 1. In some embodiments, the semiconductor device 100 further includes a redistribution layer (RDL) 112 disposed on the conductor 104 and polymer 109 as in FIG. 1.

In some embodiments, the semiconductor device 100 further includes a polymer 110 disposed over the polymer 109 and the redistribution layer 112 as in FIG. 1. In some embodiments, a recessed portion 110a of the polymer 110 is formed above a section 112a of the redistribution layer 112 as in FIG. 1. In some embodiments, the recessed portion 110a is formed from a top surface 112b of the redistribution layer 112 to a top surface 110b of the polymer 110 as in FIG. 1. In some embodiments, the semiconductor device 100 further includes a redistribution layer 113 disposed on the redistribution layer 112 and polymer 109 as in FIG. 1.

In some embodiments, the semiconductor device 100 further includes a polymer 111 disposed over the polymer 110 and the redistribution layer 113 as in FIG. 1. In some embodiments, the semiconductor device 100 further includes a via 117 formed above a section 113a of the redistribution layer 112, and a bond pad 114 is disposed on the polymer 111 and the redistribution layer 113 as in FIG. 1. In some embodiments, the semiconductor device 100 further includes a bump 115 disposed on the bond pad 114.

Figure 3:
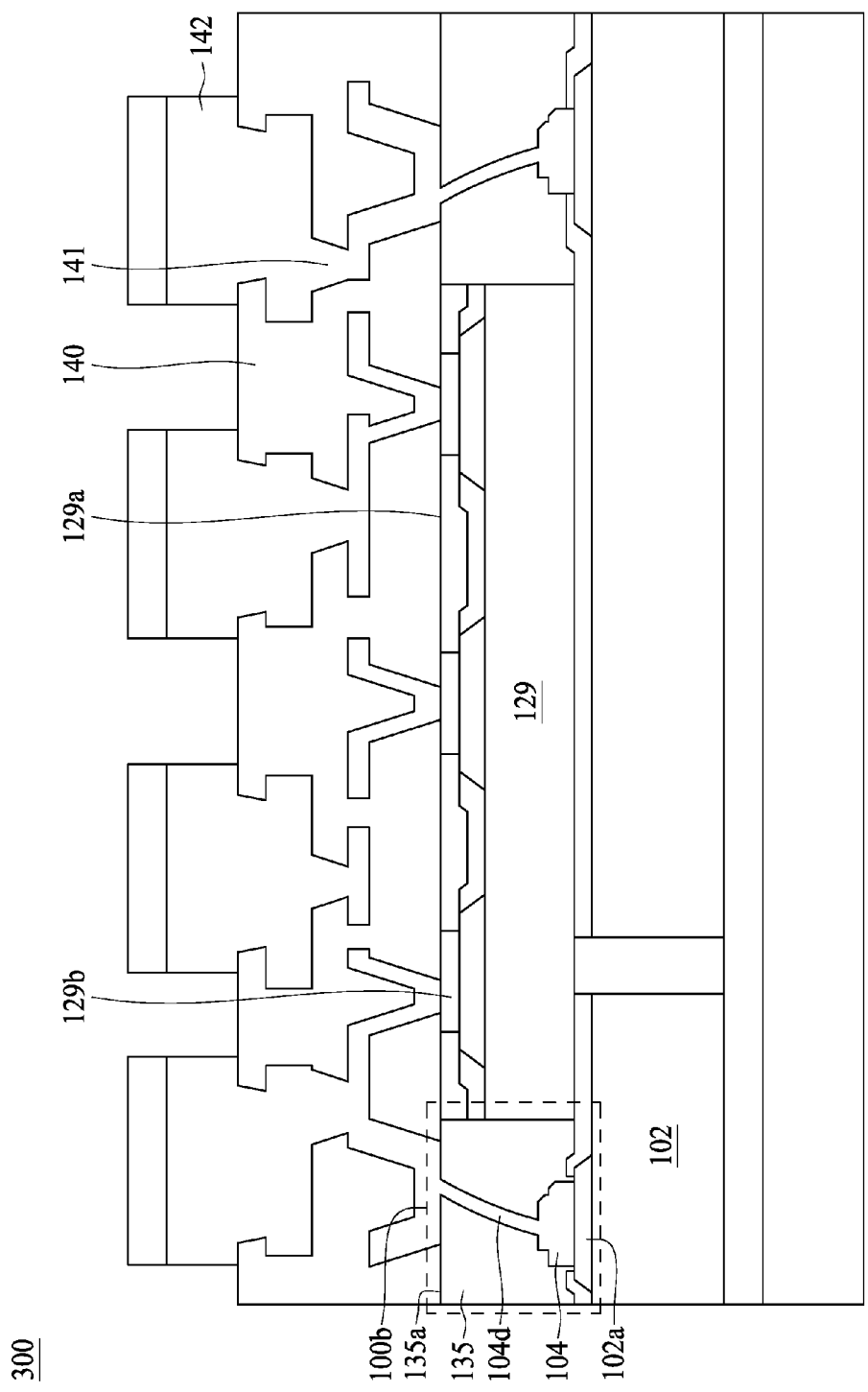
FIG. 3 is a schematic view of a semiconductor device in accordance with some embodiments.

FIG. 3 is an embodiment of a semiconductor device 300. The semiconductor device 300 includes a structure similar to the semiconductor 100 in FIG. 1 such that details of the elements indicated with the same numerical labels are not repeated herein. In some embodiments, the semiconductor device 300 further includes a semiconductor substrate 129 stacked vertically over the semiconductor substrate 102. In some embodiments, a dielectric 135 surrounds the semiconductor substrate 129. The dielectric 135 may be a single-layered molding compound. In some embodiments, a top surface 129a of the semiconductor substrate 129 is substantially coplanar with the top surface 135a of the dielectric 135. In some embodiments, the head 104d of the conductor 104 is extended to the top surface 135a of the dielectric 135. In some embodiments, the head 104d is extended in a shape of a line or curve.

Figure 3A:
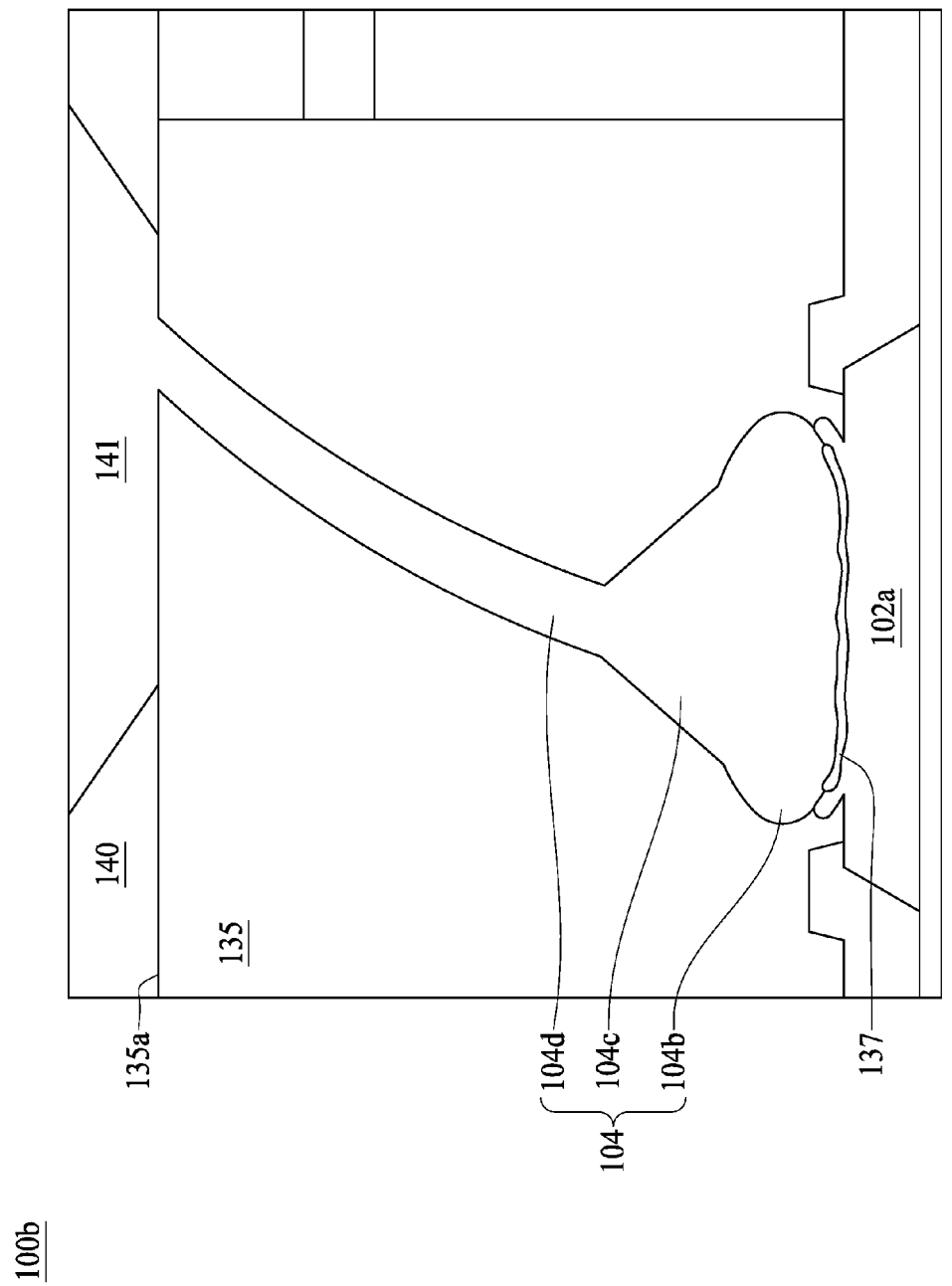
FIG. 3A is an enlarged view of a portion of a semiconductor device in FIG. 3 in accordance with some embodiments.

FIG. 3A is an enlarged view of the conductor 104 in FIG. 3. In some embodiments, the conductor 104 has a similar structure as the conductor 104 in FIG. 2, and the conductor 104 also includes body 104b, neck 104c and head 104d. The head 104d of conductor 104 is slanting relative to surface 135a and surrounded by dielectric 135. The head 104d is extended continuously through the dielectric 135 to meet top surface 135a of dielectric 135. Surface 135a is also an interface between dielectric 135 and conductive trace 141. The head 104d is further connected to conductive trace 141 at top surface 104a, which is over the dielectric 135. In some embodiments, an interface is visible between head 104d and conductive trace 141 since they are formed separately. A eutectic layer 137 is between the conductive pad 102a and the conductor 104. In some embodiments, the head 104d is formed in a shape longer and thinner than the body 104b. In some embodiments, the head 104d is formed as a portion of a parabola.

In some embodiments, a dielectric 140 is over an active surface 129b of the semiconductor substrate 129 and the top surface 135a of the dielectric 135. The active surface 129b is defined as the surface including major contacts such as bond pad, RDL, UBM, etc. configured to be connected with other components or conductive traces external to the semiconductor substrate 129. In some embodiments, the semiconductor device 300 further includes a conductive trace 141. In some embodiments, the conductive trace 141 electrically connects the head 104d and the active surface 129b. In some embodiments, the conductive trace 141 is extended to a top surface 140a of the dielectric 140. In some embodiments, the conductive trace 141 is connected to a bond pad 142. In some embodiments, the bond pad 142 is an under bump metallurgy (UBM) pad which is a solderable surface for receiving conductor. In some embodiments, the bond pad 142 includes gold, silver, copper, nickel, tungsten, aluminum, palladium and/or alloys thereof. In some embodiments, the semiconductor device 300 further includes a bump disposed on the bond pad 142.

Figure 4:
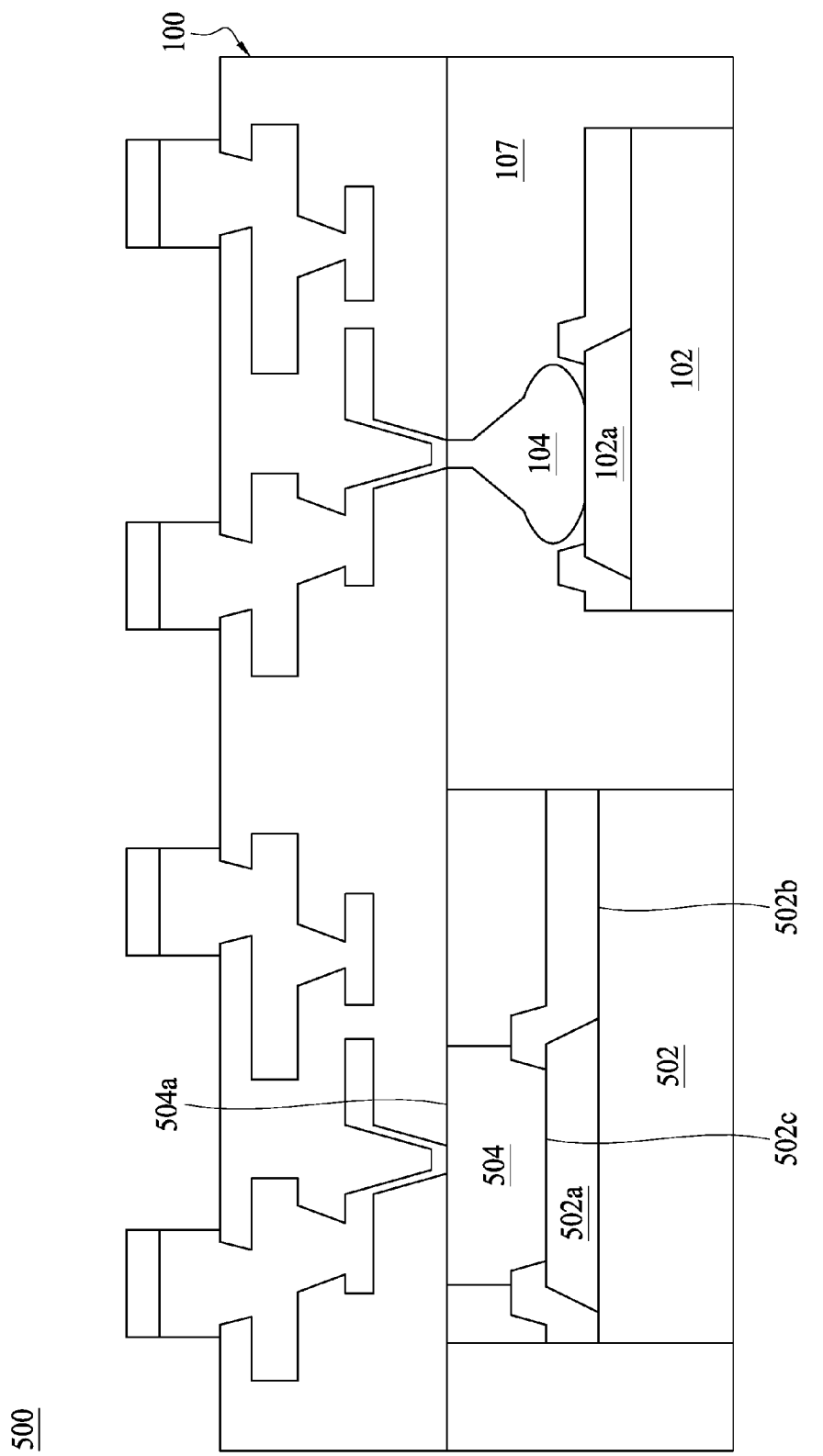
FIG. 4 is a schematic view of a semiconductor device in accordance with some embodiments.

FIG. 4 is an embodiment of a semiconductor device 500. The semiconductor device 500 includes a structure similar to the semiconductor 100 in FIG. 1 such that details of the elements indicated with the same numerical labels are not repeated herein. In some embodiments, the semiconductor device 500 further includes a semiconductor substrate 502 adjacent to the semiconductor substrate 102. In some embodiments, the semiconductor substrate 502 includes a surface 502b and a conductive pad 502a is disposed on the surface 502b. In some embodiments, a conductor 504 is disposed over the top surface 502c of the conductive pad 502a as in FIG. 4. In some embodiments, the conductor 504 is on an exposed portion of the top surface 502c. The conductor 504 is extended from the exposed portion of the top surface 502c to a top surface 504a of the conductor 504 as in FIG. 4. In some embodiments, the conductor 504 is extended along a normal direction of the surface 502b. In some embodiments, the conductor 504 is substantially upright and supported by the conductive pad 502a. In some embodiments, the conductor 504 is in a cylindrical shape with various cross-sectional shapes such as circular shape, quadrilateral shape or polygonal shape. In addition, a wide variety of materials is selected for the conductor 504 such as metal or metal alloy. In some embodiments, the conductor 504 includes copper (Cu), gold (Au), platinum (Pt), titanium (Ti), nickel (Ni), aluminum (Al), etc.

FIG. 5A-FIG. 5K includes operations of a method of manufacturing the semiconductor device 100 in FIG. 1. The method includes a number of operations (201, 202, 203, 204, 205, 206, 207, 208, 209, 210 and 211).

Figure 5A:
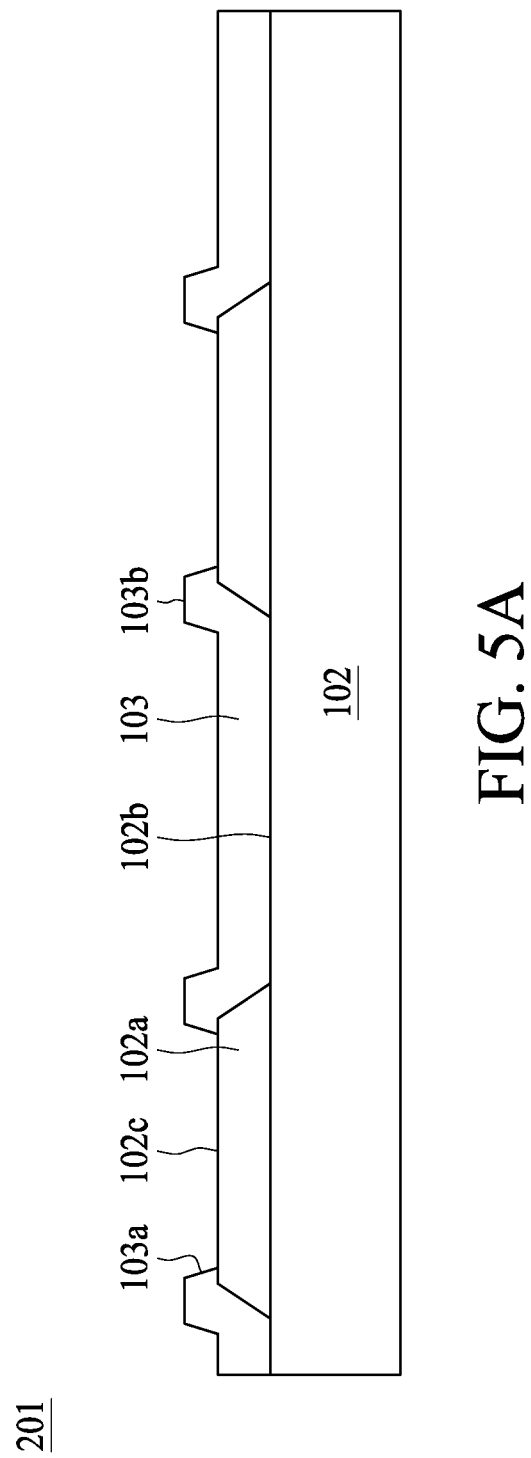

In operation 201, a semiconductor substrate 102 is provided as in FIG. 5A. In some embodiments, the semiconductor substrate 102 includes semiconductor material such as silicon. In some embodiments, a conductive pad 102a is formed on the semiconductor substrate 102 as in FIG. 5A. In some embodiments, the conductive pad 102a is disposed on a surface 102b of the semiconductor substrate 102.

In some embodiments, a passivation 103 is disposed over the semiconductor substrate 102 as in FIG. 5A. In some embodiments, some of the passivation 103 is removed to form an opening 103a as and some of the passivation 103 above a top surface 102c of the conductive pad 102a is removed by etching operations to expose the top surface 102c of the conductive pad 102a and form the opening 103a. In some embodiments, the opening 103a is extended from a top surface 103b of the passivation 103 to the top surface 102c of the conductive pad 102a.

Figure 5B:
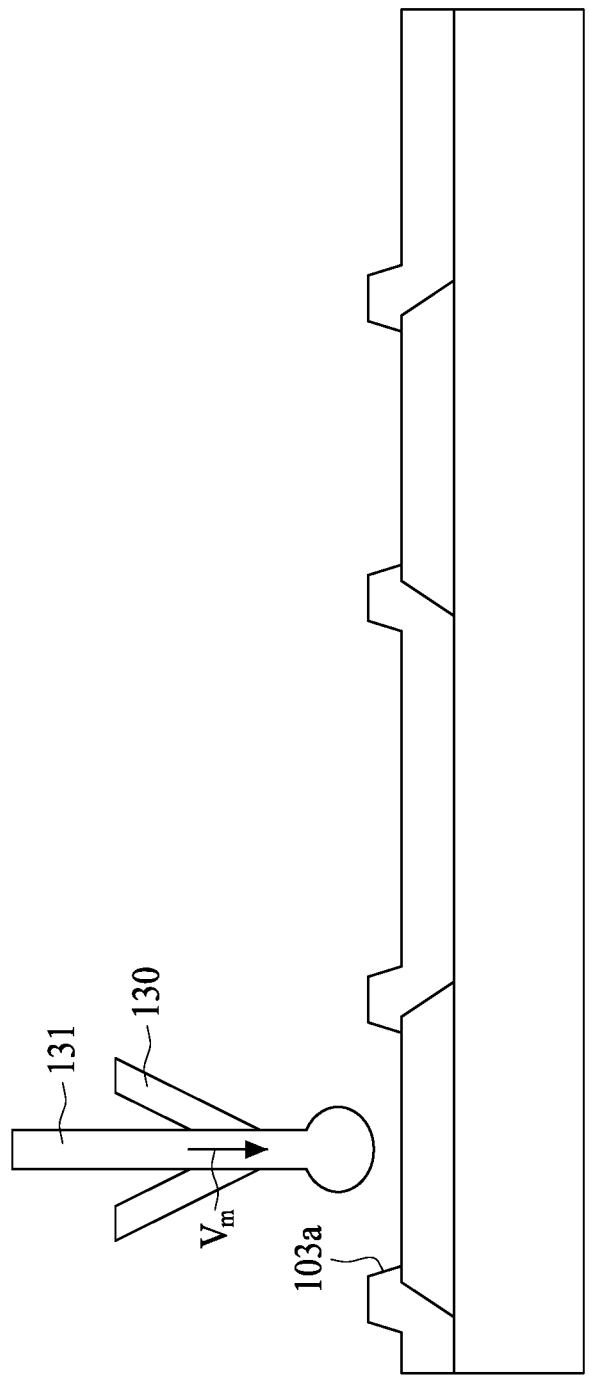

In operation 202, a nozzle 130 with a wire material 131 is provided as in FIG. 5B. In some embodiments, the nozzle 130 is configured to feed the wire material 131 continuously to form a wire bond structure. In some embodiments, the nozzle 130 is aimed at a center line of the opening 103a.

Figure 5C:
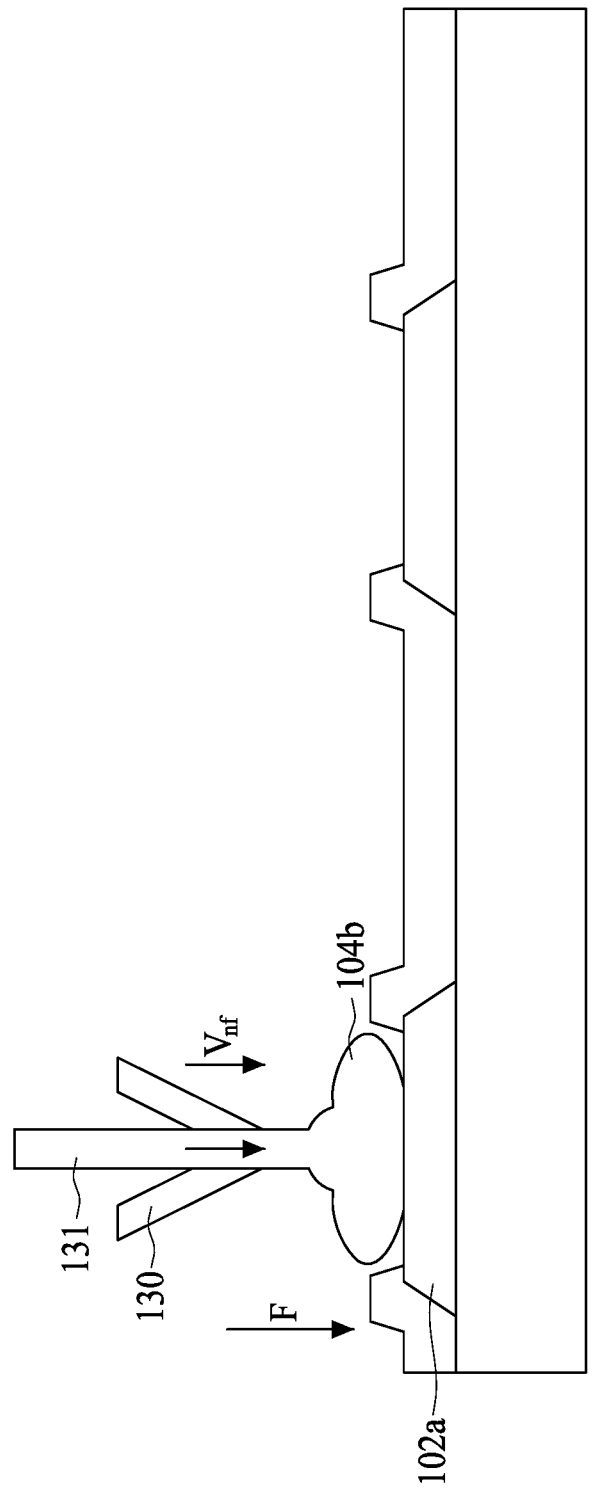
Figure 5D:
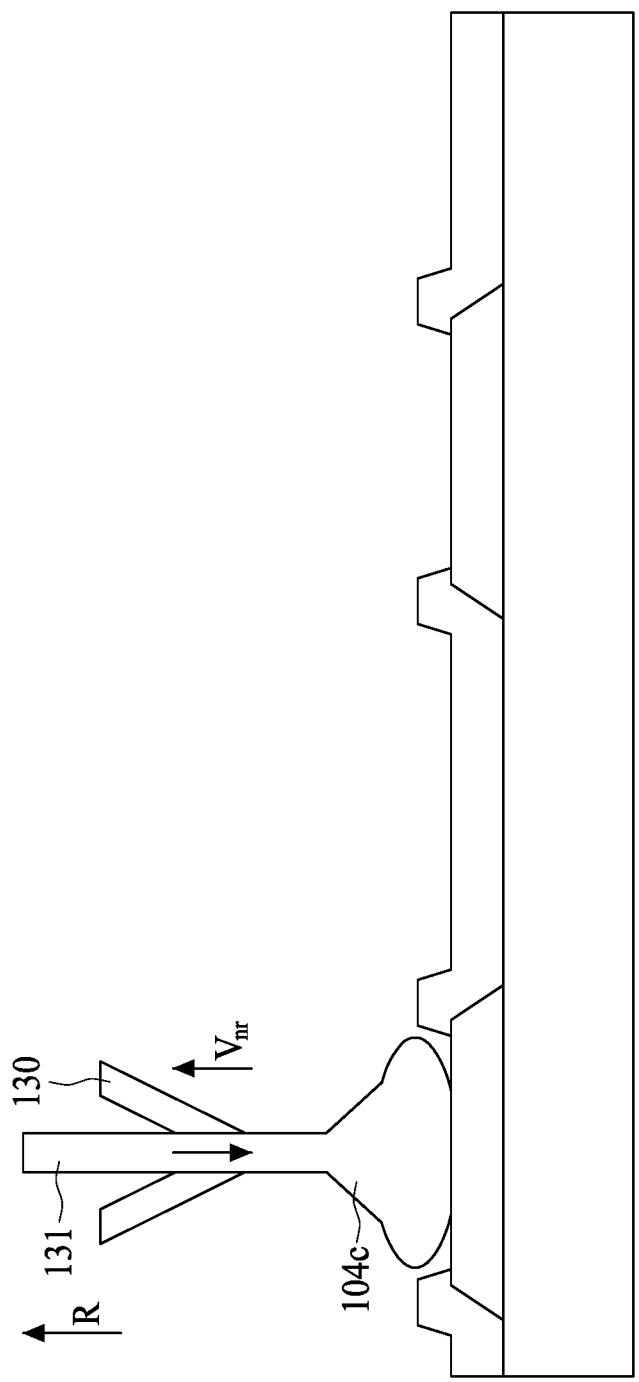

In operation 203, the nozzle 130 is moved in a feeding direction F and the wire material 131 pours out to form a body 104b as in FIG. 5C. In some embodiments, the nozzle 130 is aimed at a center line of the opening 103a and the wire material 131 pours onto the conductive pad 102a. In some embodiments, the wire material 131 pours out and expands radially to form a disc-like body 104b as in FIG. 5C.

In operation 204, the nozzle 130 moves in a return direction R opposite to the feeding direction F, and the wire material 131 is pulled back to form a cone-like or trapezoid-like neck 104c. In some embodiments, the neck 104c is formed based on the viscosity of the wire material 131 and the gravity of the wire material 131.

In operation 205, the nozzle 130 continues to move in the returning direction R and the wire material 131 is cut or stopped pouring in order to form a head 104d. In some embodiments, the body 104b, the neck 104c and the head 104d form a conductor 104.

Figure 5F:
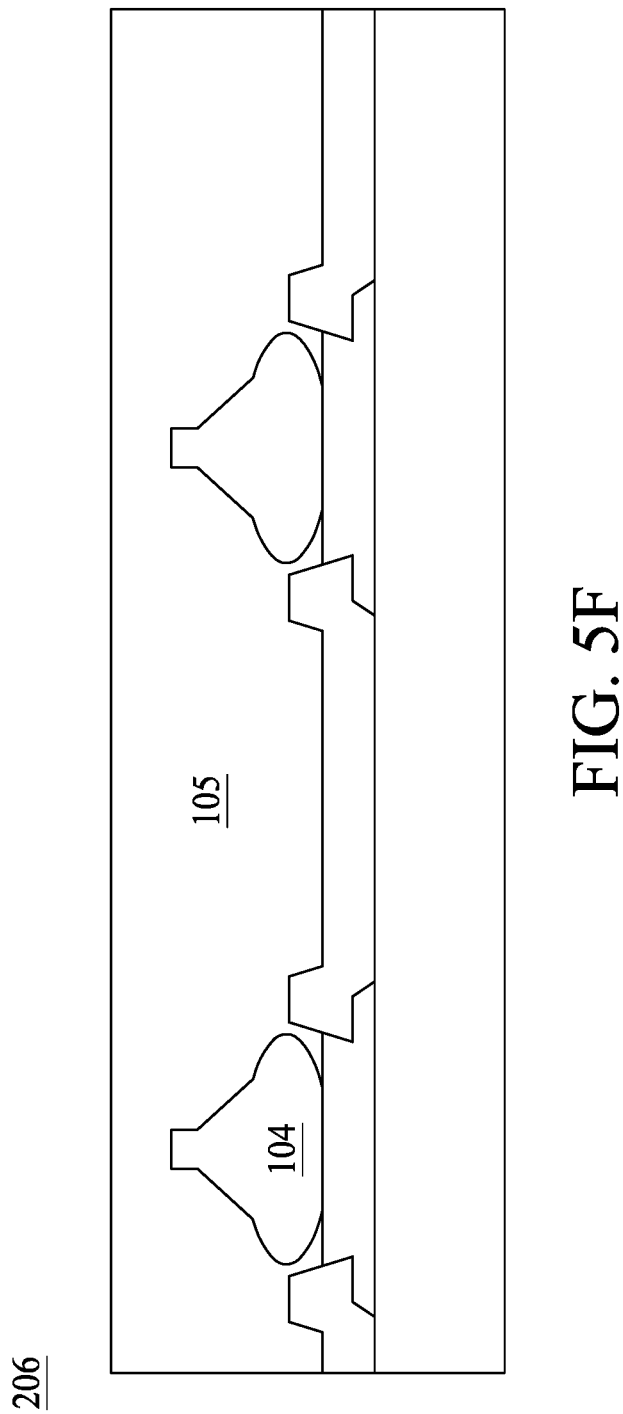

In operation 206, a dielectric 105 is disposed around the conductor 104 as in FIG. 5F. In some embodiments, the dielectric 105 surrounds the conductor 104. The dielectric 105 is configured to insulate the conductor 104 from ambient. In some embodiments, the dielectric 105 includes a polymeric material such as epoxy, polyimide, polybenzoxazole (PBO), solder resist (SR), ABF film, and the like.

Figure 5G:
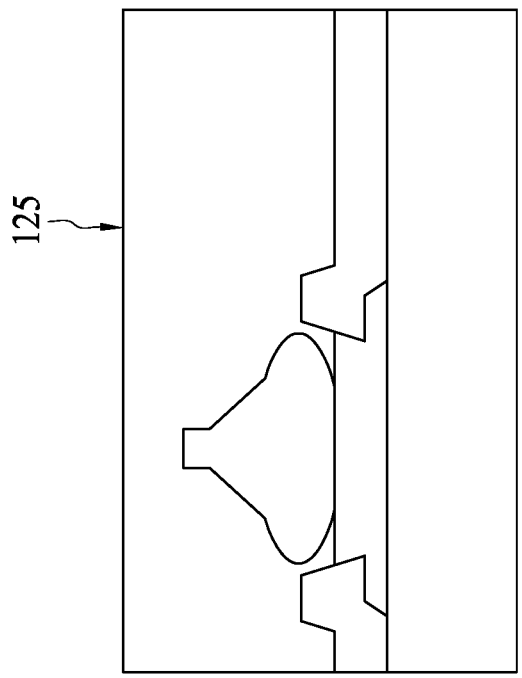

In operation 207, the semiconductor substrate 102 is singulated into several individual dies 125 as in FIG. 5G. In some embodiments, the semiconductor substrate 102 is singulated by a mechanical or laser blade.

Figure 5H:
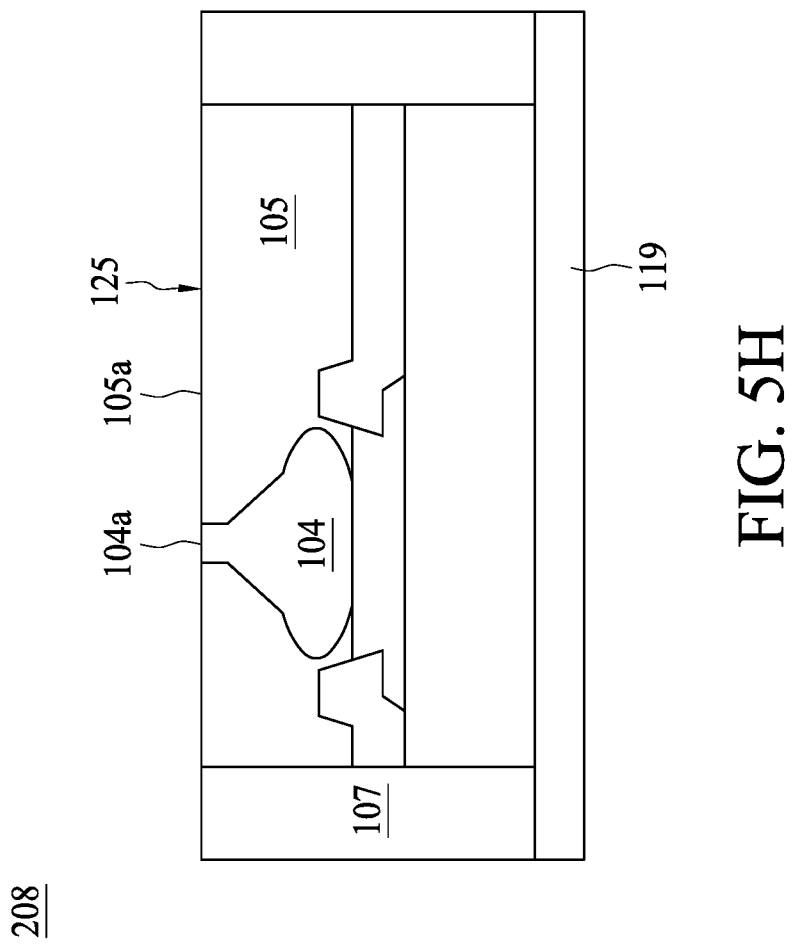

In operation 208, the die 125 singulated from the semiconductor substrate 102 is placed on a carrier 119. A molding 107 is disposed on the carrier 119 to surround the die 125. A removal or planarization operation is introduced to remove a portion of the molding 107 in order to expose the top surface 104a of the conductor 104 and a top surface 105a of the dielectric 105, such that there is no molding 107 remaining on the conductor 104 and the dielectric 105. FIG. 5H is an embodiment showing the structure after the removal operation. In some embodiments, the top portion of the molding 107, the conductor 104, and the dielectric 105 are concurrently removed by an operation such as etching or grinding in order to be coplanar.

Figure 5I:
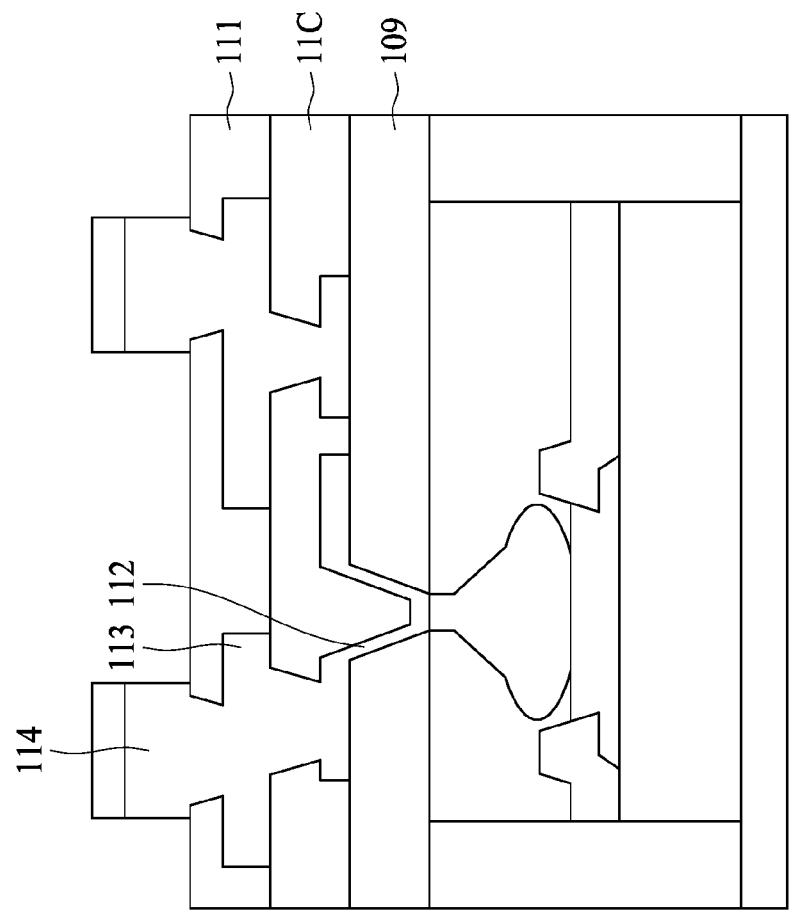

In operation 209, a dielectric 109, a redistribution layer (RDL) 112, a dielectric 110, a redistribution layer (RDL) 113, a dielectric 111 and a bond pad 114 is disposed over the semiconductor device 100 as in FIG. 5I. In some embodiments, the dielectric 109, the dielectric 110 and the dielectric 111 includes a polymeric material such as epoxy, polyimide, polybenzoxazole (PBO), solder resist (SR), ABF film, and the like. In some embodiments, the RDL 112, the RDL 113 and the bond pad 114 are disposed by electroplating or sputtering. In some embodiments, the conductor 104 is electrically connected with the bond pad 114 through the RDL 112 and the RDL 113.

Figure 5J:
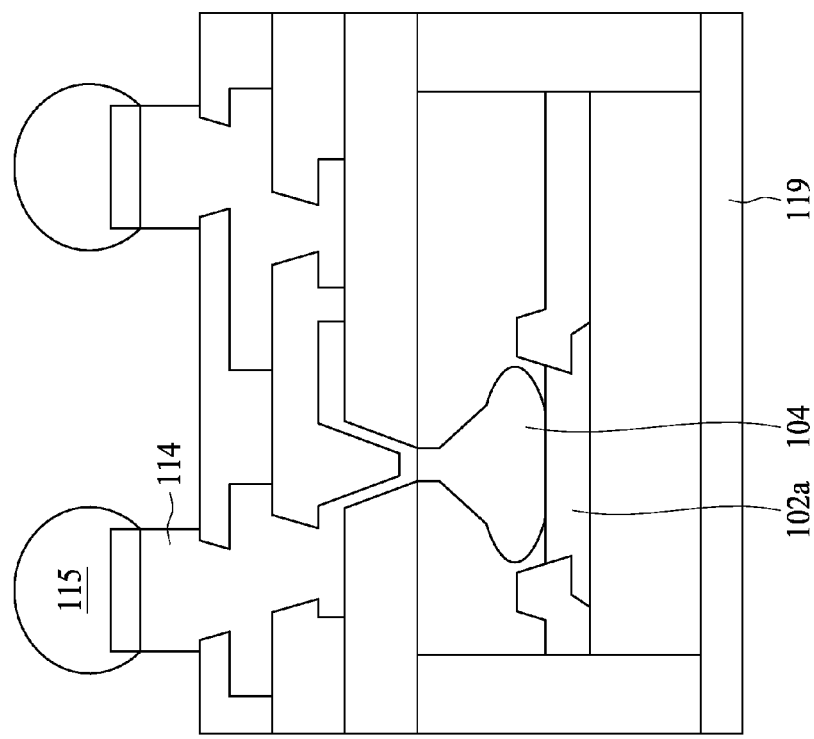

In operation 210, a bump 115 is disposed on the bond pad 114 as in FIG. 5J. In some embodiments, the bump 115 is a solder bump, solder ball, solder paste or etc. In some embodiments, the bump 115 is configured for attaching with a pad on another die, another substrate or another semiconductor package. In some embodiments, the bump 115 is a conductive bump or a conductive joint. In some embodiments, the conductive pad 102a is electrically connected with the bump 115 through the conductor 104 and the bond pad 114. In some embodiments, the bump formation operation further includes applying an oxide remover on the bond pad 114 before disposing the bump.

Figure 5K:
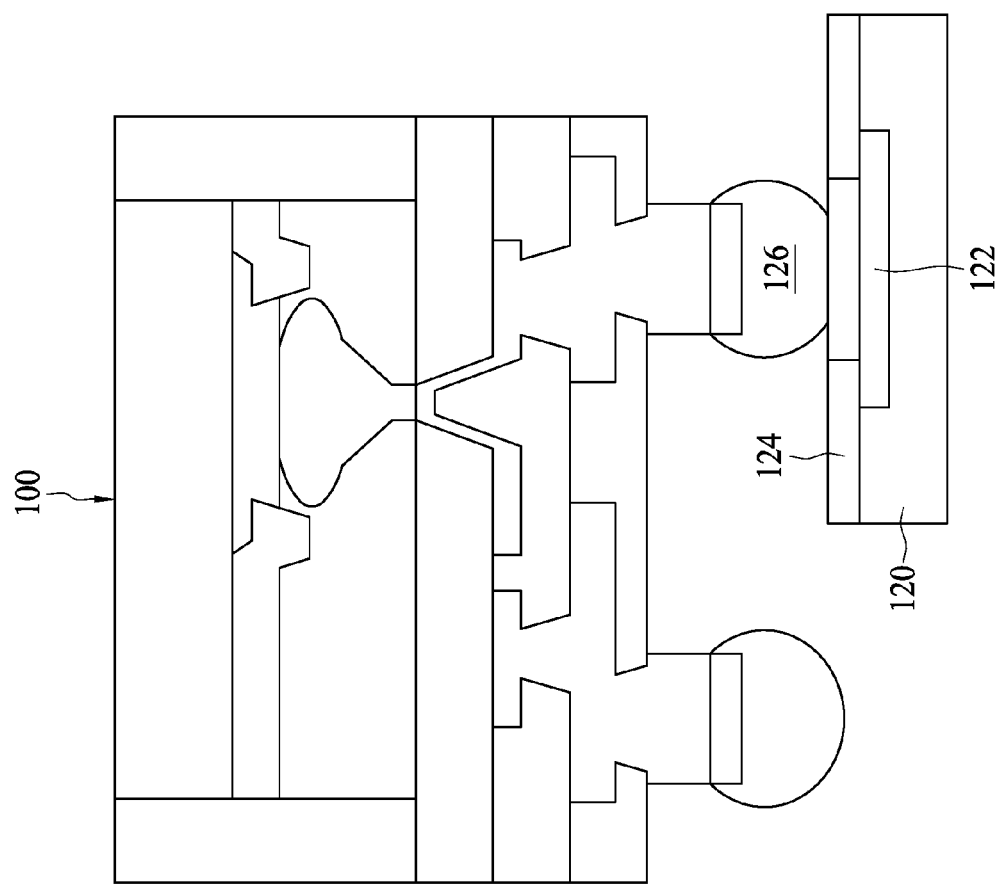

For some embodiment, operation 211 is further introduced wherein the carrier 119 in FIG. 5J is removed from the semiconductor device 100 and is flipped upside down and attached to another substrate 120 at the bottom of FIG. 5K. The substrate 120 may be a package substrate, board (e.g., a printed circuit board (PCB)), a wafer, a die, an interposer substrate, or other suitable substrate. The bump structure is coupled to the substrate 120 through various conductive attachment points. For example, a conductive region 122 is formed and patterned on the substrate 120. The conductive region 122 is a contact pad or a portion of a conductive trace, which is presented by a mask layer 124. In one embodiment, the mask layer 124 is a solder resist layer formed and patterned on the substrate 120 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device 100 can be coupled to the substrate 120 through a joint solder structure 126 between the RDL 114 and the conductive region 122. An exemplary coupling process includes a flux application, chip placement, reflowing of melting solder joints, and/or cleaning of flux residue. The semiconductor substrate 102, the joint solder structure 126, and the other substrate 120 may be referred to as a packaging assembly, or in the present embodiment, a flip-chip packaging assembly.

FIG. 6A-FIG. 6G includes operations of a method of manufacturing the semiconductor device 100 in FIG. 1. The method includes a number of operations (401, 402, 403, 404, 405, 406 and 407). In operation 401, a substrate 136 is provided and a semiconductor substrate 102 is placed on the substrate 136 as in FIG. 6A. In operation 402, a molding 107 is disposed around the semiconductor substrate 102 and a semiconductor substrate 129 is stacked over the semiconductor substrate 102 as in FIG. 6B. In the present disclosure, a nozzle feeds a wire material 131 and the wire material 131 pours out to form a conductor 104 on a conductive pad 102a of the semiconductor substrate 102. In some embodiments, the conductor 104 is formed similarly to operation 202-204 as in FIG. 5B to FIG. 5D.

In operation 403, a head 104d of the conductor 104 is extended to a top surface 129a of the semiconductor substrate 129. In operation 404, the head 104d is extended to an active surface 129b on the top surface 129a to form another wire bond structure 143. In some embodiments, the semiconductor substrate 102 and the semiconductor substrate 129 are electrically connected through the conductor 104.

Figure 6A:
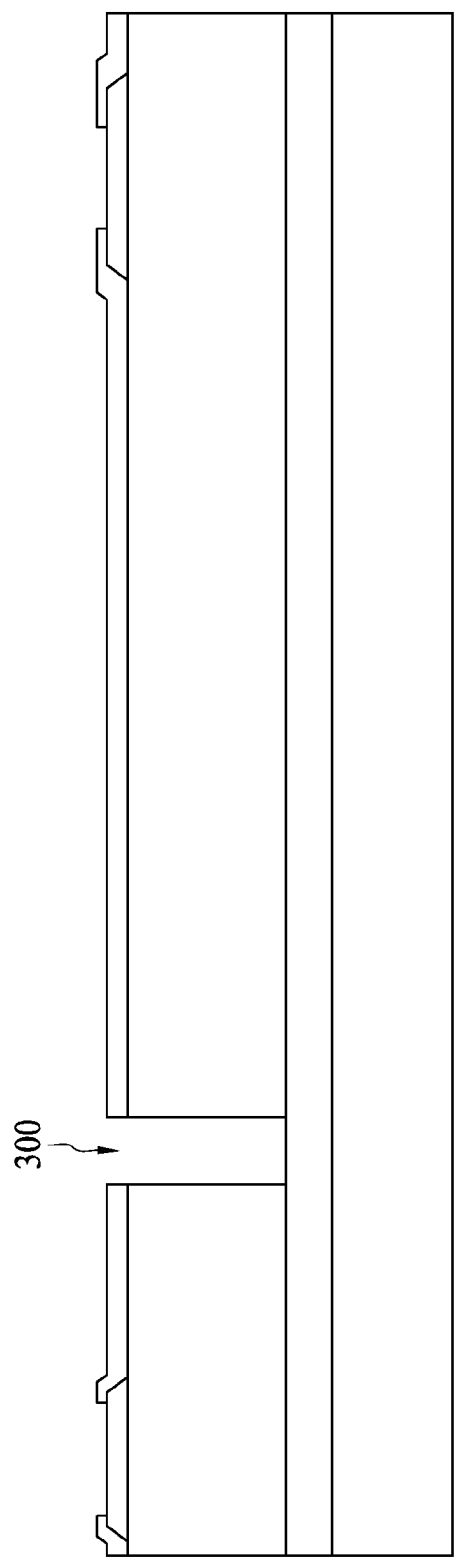
FIG. 6A-FIG. 6G are operations of a method of manufacturing a semiconductor devices in accordance with some embodiments.
Figure 6B:
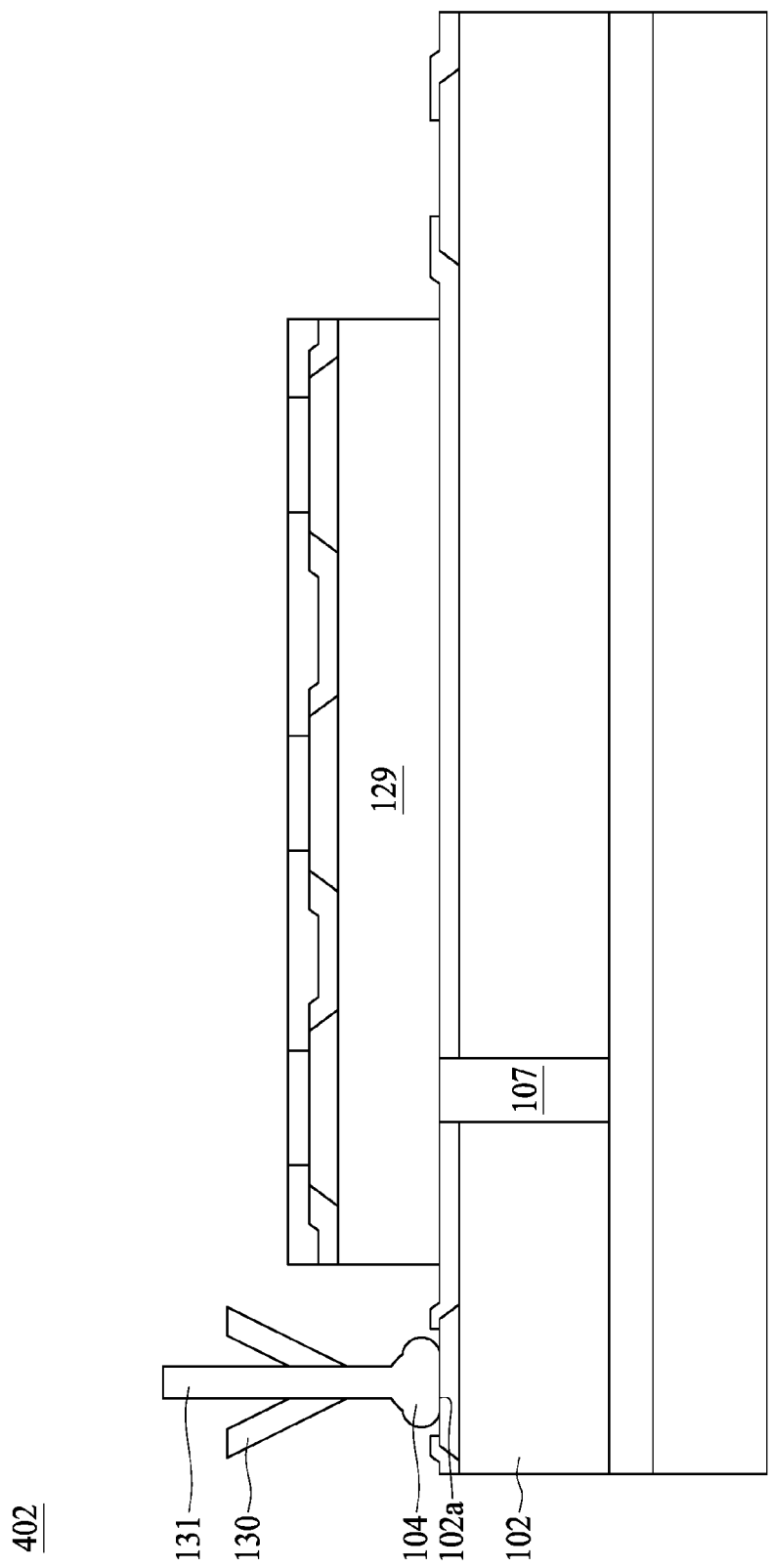
Figure 6C:
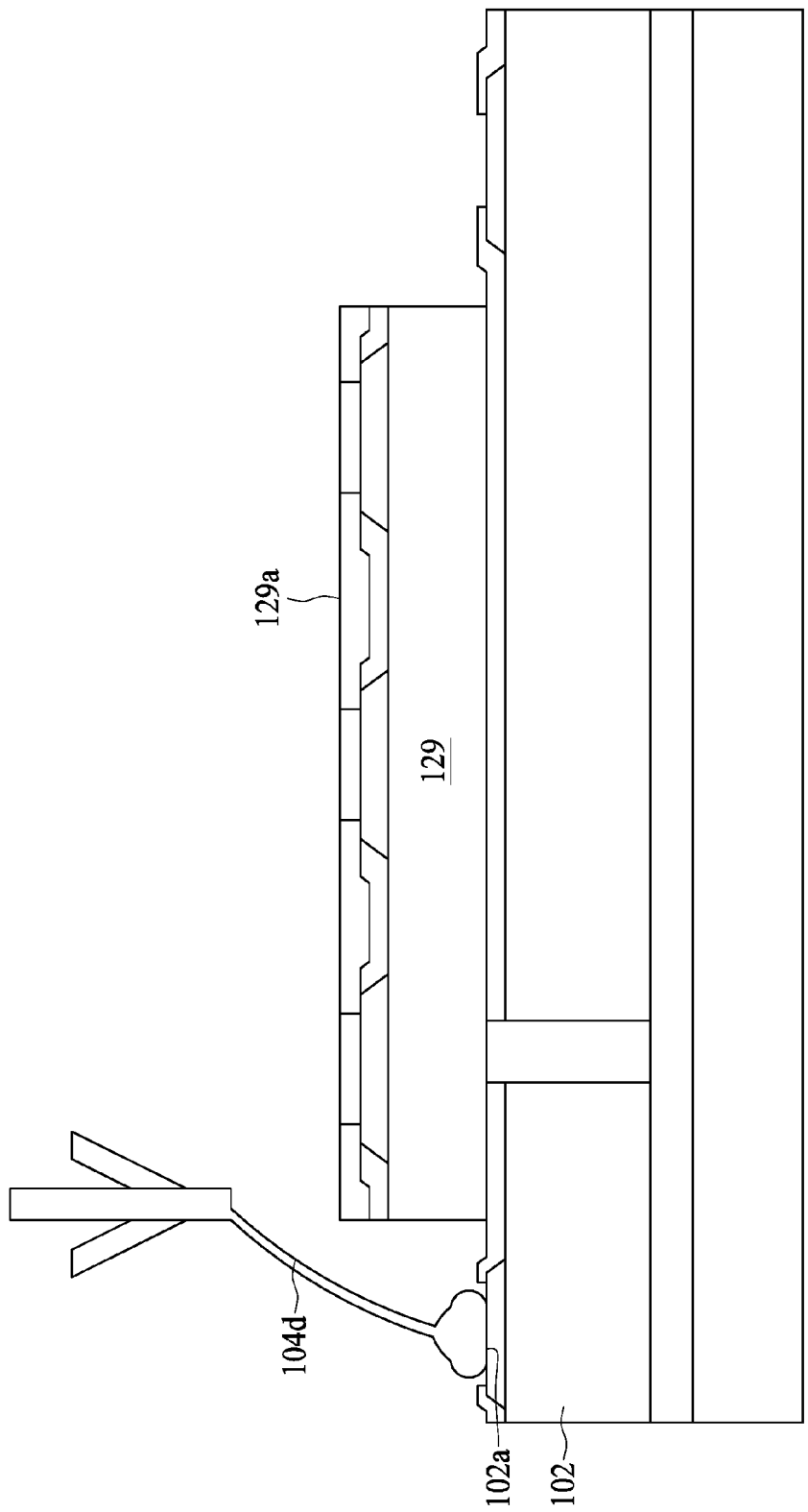
Figure 6D:
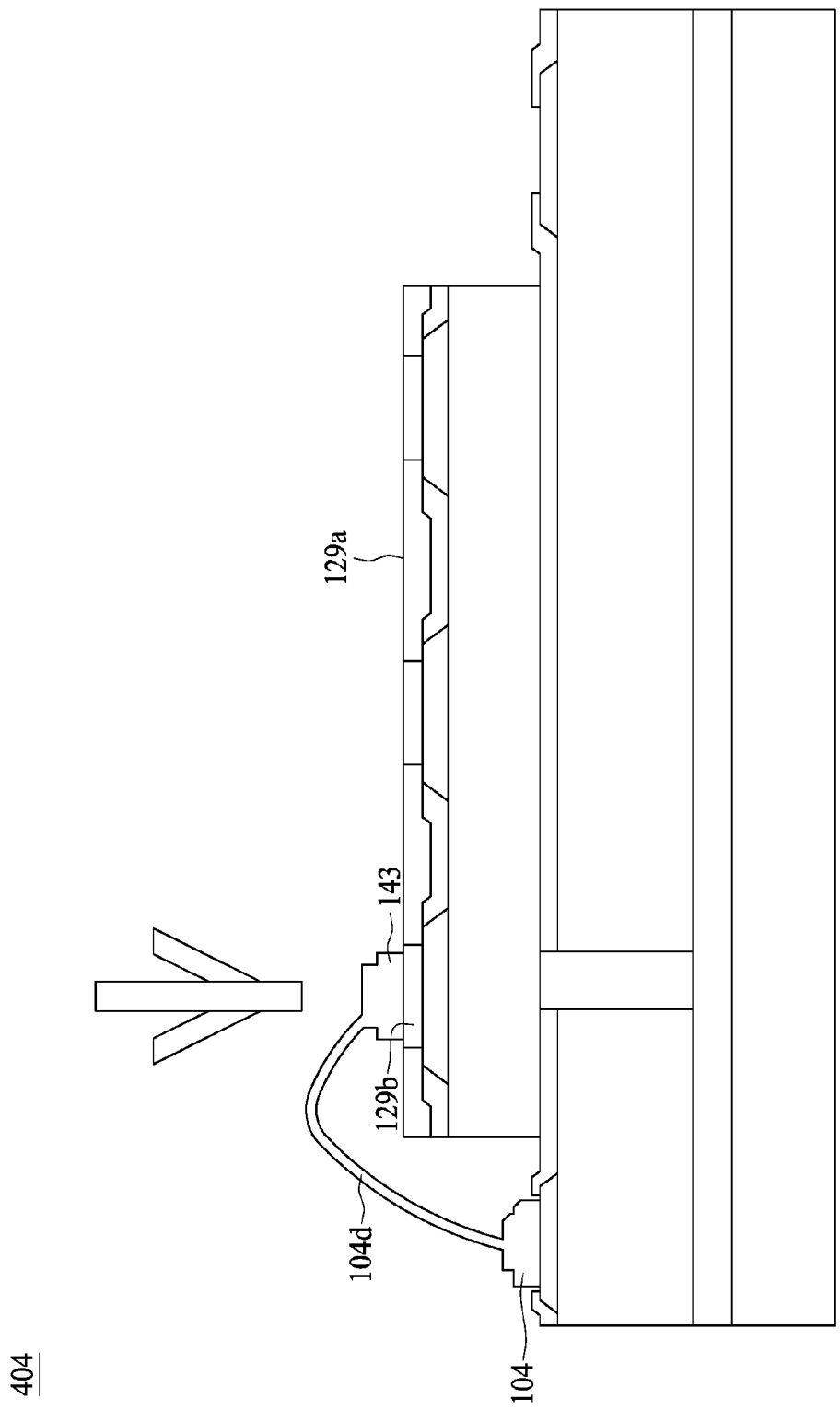
Figure 6E:
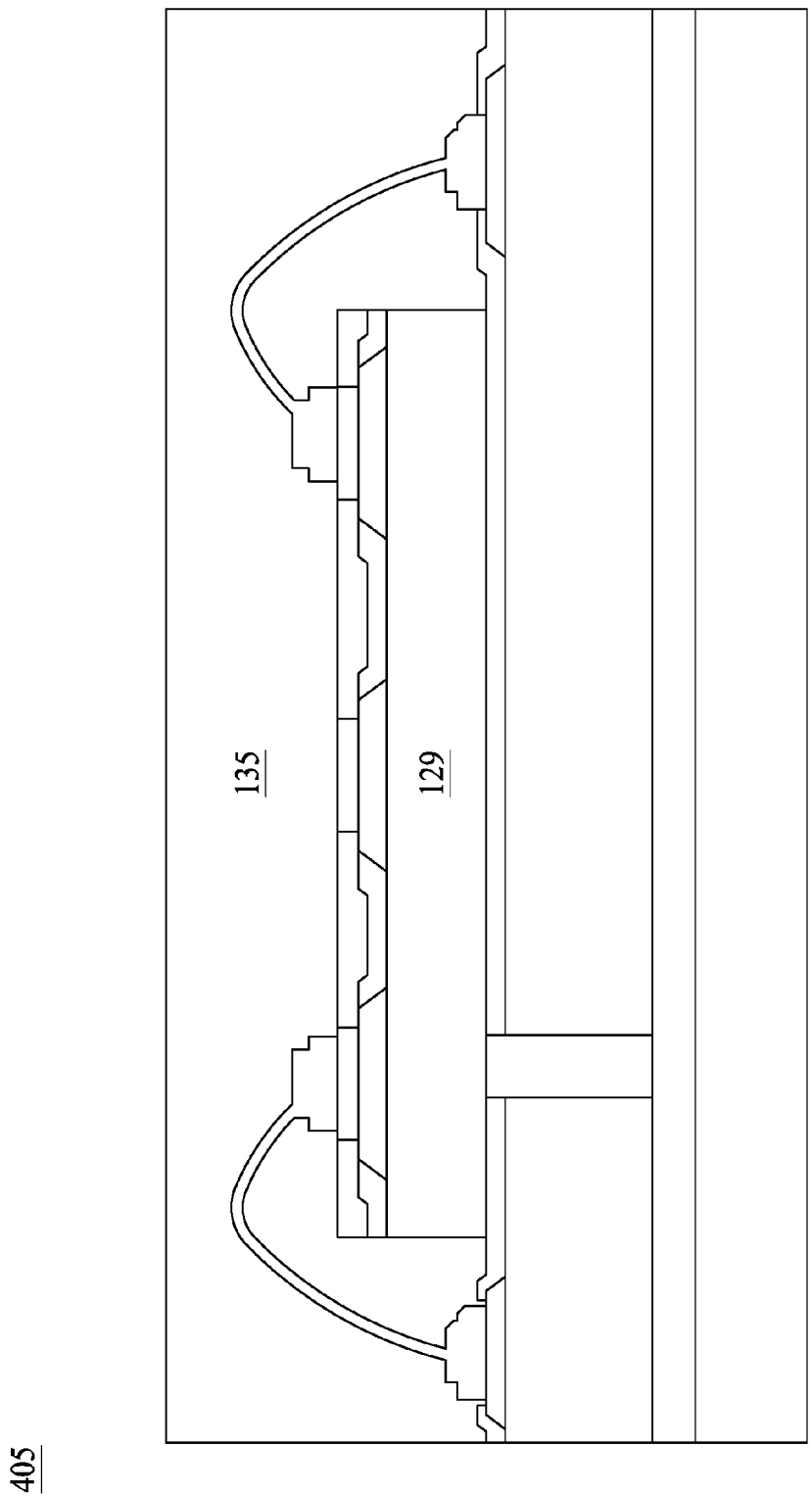
Figure 6F:
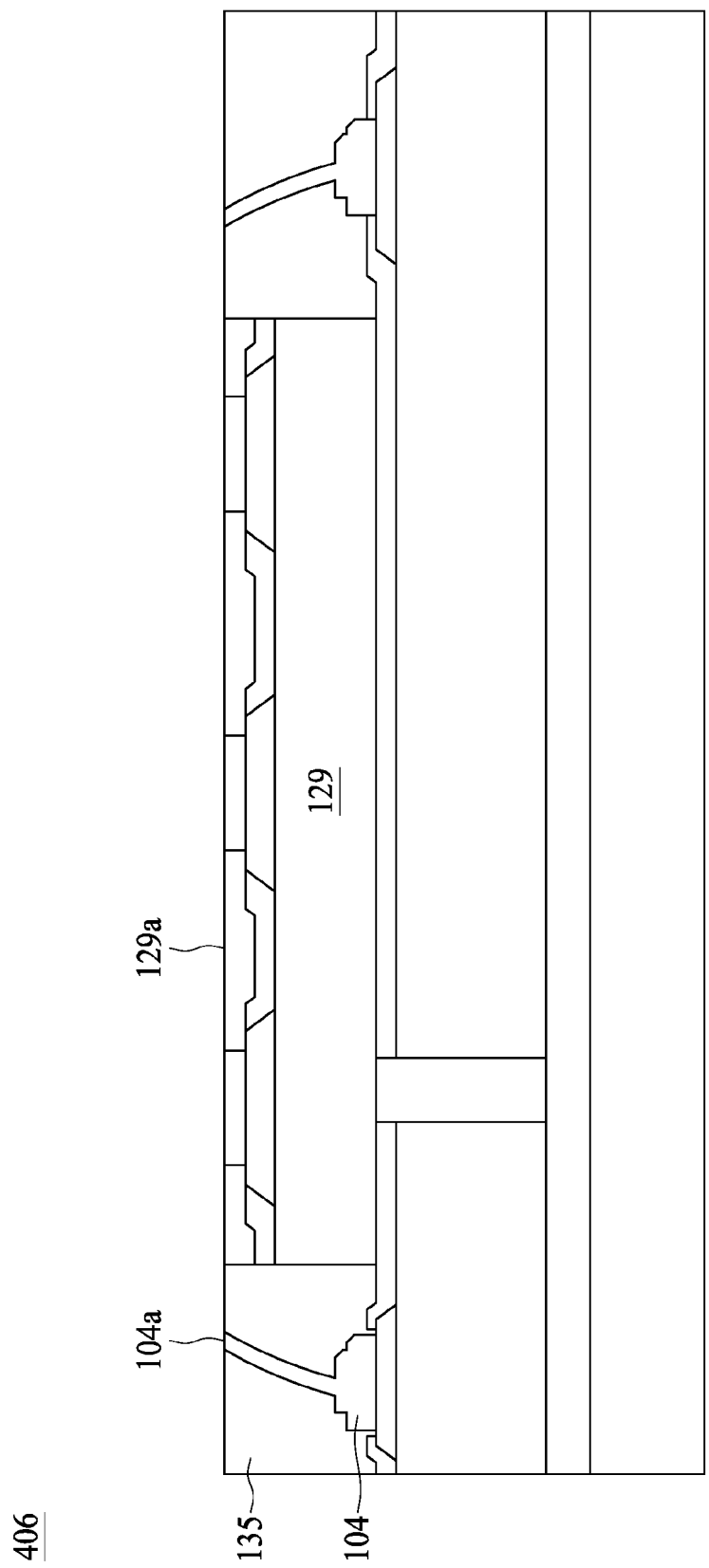
Figure 6G:
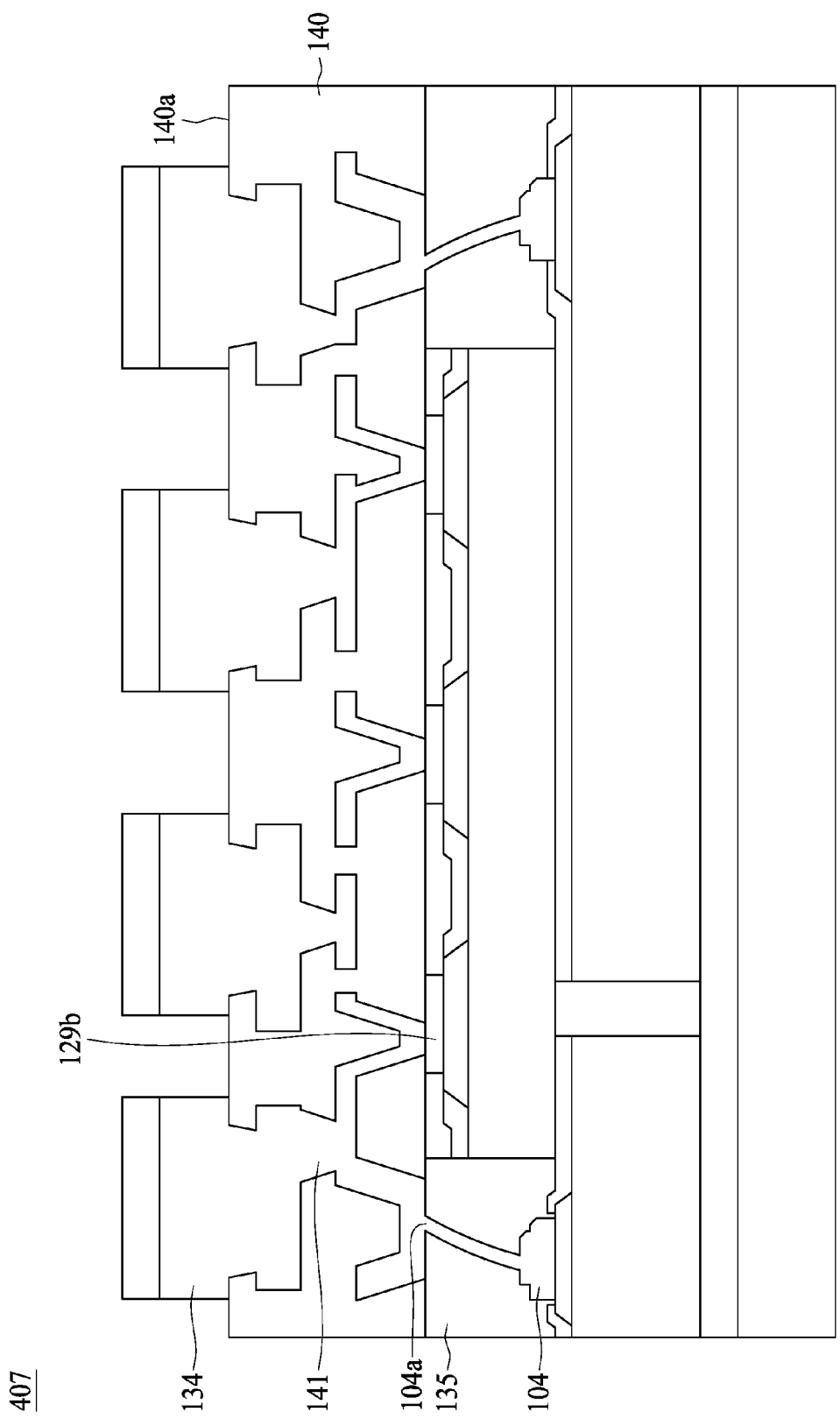

In operation 405, a dielectric 135 is further disposed over the semiconductor substrate 102, the conductor 104, the wire bond structure 143 and the semiconductor substrate 129 as in FIG. 6E. In operation 406, a removal or planarization operation is introduced to remove a portion of the dielectric 135 in order to expose the top surface 129a of the semiconductor substrate 129 and a top surface 104a of the conductor 104 as in FIG. 6F. In operation 407, a dielectric 140 and a conductive trace 141 are disposed over the semiconductor device 300 as in FIG. 6G. In some embodiments, the conductor 104 and the top surface 129a of the semiconductor substrate 129 are connected through the conductive trace 141. In some embodiments, the conductive trace 141 connects the top surface 104a of the conductor 104 and the active surface 129b of the semiconductor substrate 129. In some embodiments, the conductive trace 141 is extended to a top surface 140a of the dielectric 140 and connected to a bond pad 134.

In some embodiments, a semiconductor device includes a semiconductor substrate 102, a conductive pad 102a on the semiconductor substrate 102, and a conductor 104 over the conductive pad 102a. The semiconductor device further has a molding compound 107 surrounding the semiconductor substrate 102, the conductive pad 102a and the conductor 104. In the semiconductor device, the conductor 104 has a stud shape.

In some embodiments, a semiconductor device 100 includes a semiconductor substrate 102, a conductive pad 102a on the semiconductor substrate 102, and a conductor 104 over the conductive pad 102a. The semiconductor device further has a molding compound 107 surrounding the semiconductor substrate 102, the conductive pad 102a and the conductor 104. In the semiconductor device, the conductor 104 has a wire-like head and the head extends to a top surface of the molding compound 107.

In some embodiments, a method of manufacturing a semiconductor device 100 includes providing a semiconductor substrate 102, forming a conductive pad 102a on the semiconductor substrate 102, and disposing a conductor 104 on the conductive pad 102a, wherein the conductor 104 is a portion of a wire bond structure. The method further has disposing a dielectric 105 over the conductor 104 and disposing a molding 107 over the semiconductor substrate 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a conductive pad over the semiconductor substrate;
   a conductor over the conductive pad;
   a molding compound surrounding the semiconductor substrate, the conductive pad and the conductor; and
   a conductive trace over the molding compound,
   wherein the conductor includes a body, a neck over the body, and a head over the neck, and a widest width of the body is wider than a widest width of the neck, and the widest width of the neck is wider than a widest width of the head, and the head is connected to the conductive trace.

2. The semiconductor device of claim 1, wherein an eutectic layer is formed at an interface between the conductor and the conductive pad.

3. The semiconductor device of claim 2, wherein the eutectic layer comprises a compound of the conductive pad and the conductor.

4. The semiconductor device of claim 2, wherein the eutectic layer has a melting point lower than the conductive pad or the conductor.

5. The semiconductor device of claim 2, wherein a protrusion of the conductive pad is adjacent the eutectic layer.

6. The semiconductor device of claim 5, wherein a crevice is between the conductor and the protrusion.

7. The semiconductor device of claim 5, wherein a width W4 of the conductor and a contact point of the crevice ranges from about 25 um to about 125 um.

8. The semiconductor device of claim 1, wherein a contact angle θ1 between a tangent line to a sidewall of the conductor at the contact point and a horizontal line ranges from about +100 degrees to about +180 degrees.

9. The semiconductor device of claim 1, wherein the conductor further comprises a neck connecting a body to a head.

10. The semiconductor device of claim 9, wherein a radius of curvature of sidewall of the body ranges from about 20 um to about 150 um.

11. The semiconductor device of claim 9, wherein a radius of curvature of sidewall of the neck ranges from about 5 um to about 300 um.

12. The semiconductor device of claim 1, wherein the conductor has a height ranges from about 20 um to about 900 um.

13. The semiconductor device of claim 1, wherein the conductor has a maximum width ranges from about 50 um to about 250 um.

14. The semiconductor device of claim 1, wherein further comprises a dielectric between the conductor and the molding compound.

15. A semiconductor device, comprising:
   a semiconductor substrate;
   a conductive pad over the semiconductor substrate;
   a conductor over the conductive pad;
   a molding compound surrounding the semiconductor substrate, the conductive pad and the conductor; and
   a conductive trace over the molding;
   wherein the conductor is connected to the conductive trace and has a wire-like head and the head extends to a top surface of the molding compound, and the conductive pad includes a protrusion, and a sidewall of the conductor and the protrusion jointly form a crevice.

16. The semiconductor device of claim 15, wherein the conductor is surrounded by the molding.

17. The semiconductor device of claim 15, wherein the head is slanting.

18. The semiconductor device of claim 15, wherein the conductor is slanting relative to an surface of the molding, wherein the surface is an interface between the molding and the conductive trace over the molding.

19. A method of manufacturing a semiconductor device, comprising:
   providing a semiconductor substrate;
   forming a conductive pad over the semiconductor substrate;
   disposing a conductor on the conductive pad, and a sidewall of the conductor and a protrusion of the conductive pad jointly forming a crevice;
   disposing a dielectric over the conductor;
   disposing a molding over the semiconductor substrate; and
   disposing a conductive trace over the molding.

20. The method of claim 19, wherein disposing the conductor comprises an operation of wire-bonding.

* * * * *